(12) United States Patent
Zhang et al.

(10) Patent No.: US 11,854,613 B2
(45) Date of Patent: Dec. 26, 2023

(54) PROGRAM AND READ OPERATIONS USING DIFFERENT GRAY CODES AND MEMORY DEVICE FOR PERFORMING THE SAME

(71) Applicant: YANGTZE MEMORY TECHNOLOGIES CO., LTD., Wuhan (CN)

(72) Inventors: Chao Zhang, Wuhan (CN); Haibo Li, Wuhan (CN); Ken Hu, Wuhan (CN); Yunxiang Wu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 249 days.

(21) Appl. No.: 17/502,489

(22) Filed: Oct. 15, 2021

(65) Prior Publication Data

US 2022/0319591 A1 Oct. 6, 2022

Related U.S. Application Data

(63) Continuation of application No. PCT/CN2021/084711, filed on Mar. 31, 2021.

(51) Int. Cl.
*G11C 11/16* (2006.01)
*G11C 11/56* (2006.01)
(Continued)

(52) U.S. Cl.
CPC ........ *G11C 11/5671* (2013.01); *G06F 3/0604* (2013.01); *G06F 3/0655* (2013.01);
(Continued)

(58) Field of Classification Search
CPC .................................................. G11C 11/1693
See application file for complete search history.

(56) References Cited

U.S. PATENT DOCUMENTS

| 2008/0285352 A1 | 11/2008 | Cho et al. |
| 2017/0162266 A1 | 6/2017 | Seol et al. |

(Continued)

FOREIGN PATENT DOCUMENTS

| CN | 111383689 A | 7/2020 |
| CN | 111667868 A | 9/2020 |
| DE | 102019133129 A1 | 9/2020 |

OTHER PUBLICATIONS

International Search Report issued in corresponding International Application No. PCT/CN2021/084711 dated Dec. 30, 2021, 4 pages.

(Continued)

*Primary Examiner* — Jason Lappas
(74) *Attorney, Agent, or Firm* — BAYES PLLC

(57) ABSTRACT

A memory device is provided. The memory device includes an array of memory cells arranged in a plurality of rows, a plurality of word lines respectively coupled to the plurality of rows of the memory cells, and a peripheral circuit coupled to the word lines. The peripheral circuit is configured to convert a first value to a second value based on a mapping relationship between a read gray code and a program gray code, perform a program operation to program the second value into a memory cell as a state based on the read gray code, and perform a read operation to read out the state from the memory cell based on the read gray code to be the first value.

20 Claims, 10 Drawing Sheets

(51) Int. Cl.
   *G06F 3/06* (2006.01)
   *G11C 16/04* (2006.01)
   *G11C 16/08* (2006.01)
   *G11C 16/10* (2006.01)
   *G11C 16/24* (2006.01)
   *G11C 16/26* (2006.01)

(52) U.S. Cl.
   CPC ........ *G06F 3/0679* (2013.01); *G11C 16/0483* (2013.01); *G11C 16/08* (2013.01); *G11C 16/10* (2013.01); *G11C 16/24* (2013.01); *G11C 16/26* (2013.01)

(56) References Cited

U.S. PATENT DOCUMENTS

| | | |
|---|---|---|
| 2019/0213074 A1 | 7/2019 | Bhatia et al. |
| 2019/0295654 A1 | 9/2019 | Lee et al. |
| 2020/0192807 A1 | 6/2020 | Rub et al. |
| 2020/0286533 A1* | 9/2020 | Zhang ................ G11C 11/1693 |

OTHER PUBLICATIONS

Office action issued in corresponding Chinese Application No. 202180001107.6, dated May 30, 2021, 12 pages.

* cited by examiner

FIG. 6A

| Read Times | LP | MP | UP | XP |
|---|---|---|---|---|
| 0 | 1 | 1 | 1 | 1 |
| 1 | 0 | 1 | 1 | 1 |
| 2 | 0 | 1 | 1 | 0 |
| 3 | 0 | 0 | 1 | 0 |
| 4 | 1 | 0 | 1 | 0 |
| 5 | 1 | 0 | 0 | 0 |
| 6 | 0 | 0 | 0 | 0 |
| 7 | 0 | 1 | 0 | 0 |
| 8 | 0 | 1 | 0 | 1 |
| 9 | 0 | 0 | 0 | 1 |
| 10 | 0 | 0 | 1 | 1 |
| 11 | 1 | 0 | 1 | 1 |
| 12 | 1 | 0 | 0 | 1 |
| 13 | 1 | 1 | 0 | 1 |
| 14 | 1 | 1 | 0 | 0 |
| 15 | 1 | 1 | 1 | 0 |
| Total | 4 | 4 | 4 | 3 |

LUT 1

| Pi | 0 | 1 | 2 | 3 | 4 | 5 | 6 | 7 | Read Times |
|---|---|---|---|---|---|---|---|---|---|
| LP | 1 | 1 | 0 | 0 | 0 | 1 | 1 | 1 | 2 |
| MP | 1 | 1 | 0 | 0 | 1 | 1 | 0 | 0 | 3 |
| UP | 1 | 1 | 1 | 0 | 0 | 0 | 0 | 1 | 2 |

LUT 2

| Pi | 0 | 1 | 2 | 3 | 4 | 5 | 6 | 7 | 8 | 9 | 10 | 11 | 12 | 13 | 14 | 15 | Read Times |
|---|---|---|---|---|---|---|---|---|---|---|---|---|---|---|---|---|---|
| LP | 1 | 1 | 0 | 0 | 0 | 0 | 0 | 0 | 0 | 0 | 1 | 1 | 1 | 1 | 1 | 1 | 2 |
| MP | 1 | 1 | 1 | 1 | 0 | 0 | 0 | 0 | 1 | 1 | 1 | 1 | 0 | 0 | 0 | 0 | 3 |
| UP | 1 | 1 | 1 | 1 | 1 | 1 | 0 | 0 | 1 | 0 | 0 | 0 | 0 | 0 | 1 | 1 | 2 |
| XP | 1 | 0 | 0 | 1 | 1 | 0 | 0 | 1 | 1 | 0 | 0 | 1 | 1 | 0 | 0 | 1 | 8 |

FIG. 6B

PROGRAM AND READ OPERATIONS USING DIFFERENT GRAY CODES AND MEMORY DEVICE FOR PERFORMING THE SAME

CROSS-REFERENCE TO RELATED APPLICATIONS

This application is continuation of International Application No. PCT/CN2021/084711, filed on March 31, entitled "PROGRAM AND READ OPERATIONS USING DIFFERENT GRAY CODES AND MEMORY DEVICE FOR PERFORMING THE SAME," which is hereby incorporated by reference in its entirety.

BACKGROUND

The present disclosure relates to memory devices and operations thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes an array of memory cells arranged in a plurality of rows, a plurality of word lines respectively coupled to the plurality of rows of the memory cells, and a peripheral circuit coupled to the word lines. The peripheral circuit is configured to convert a first value to a second value based on a mapping relationship between a read gray code and a program gray code, perform a program operation to program the second value into a memory cell as a state based on the read gray code, and perform a read operation to read out the state from the memory cell based on the read gray code to be the first value.

In another aspect, a method for operating a memory device is provided. The memory device includes an array of memory cells arranged in a plurality of rows and a plurality of word lines respectively coupled to the plurality of rows of the memory cells. The method includes converting a first value to a second value based on a mapping relationship between a read gray code and a program gray code, performing a program operation to program the second value into a memory cell as a state based on the read gray code, and performing a read operation to read out the state from the memory cell based on the read gray code to be the first value.

In still another aspect, a system includes an array of memory cells arranged in a plurality of rows, a plurality of word lines respectively coupled to the plurality of rows of the memory cells, and a peripheral circuit coupled to the word lines. The peripheral circuit is configured to convert a first value to a second value based on a mapping relationship between a read gray code and a program gray code, perform a program operation to program the second value into a memory cell as a state based on the read gray code, and perform a read operation to read out the state from the memory cell based on the read gray code to be the first value. The system also includes a memory controller coupled to the memory device and configured to control the memory device.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 6A illustrates a gray code for a 16-16 scheme on a memory cell in a string in an exemplary memory array device, according to some aspects of the present disclosure.

FIG. 6B illustrates a gray code for an 8-16 scheme, according to some aspects of the present disclosure.

Figure 1A:
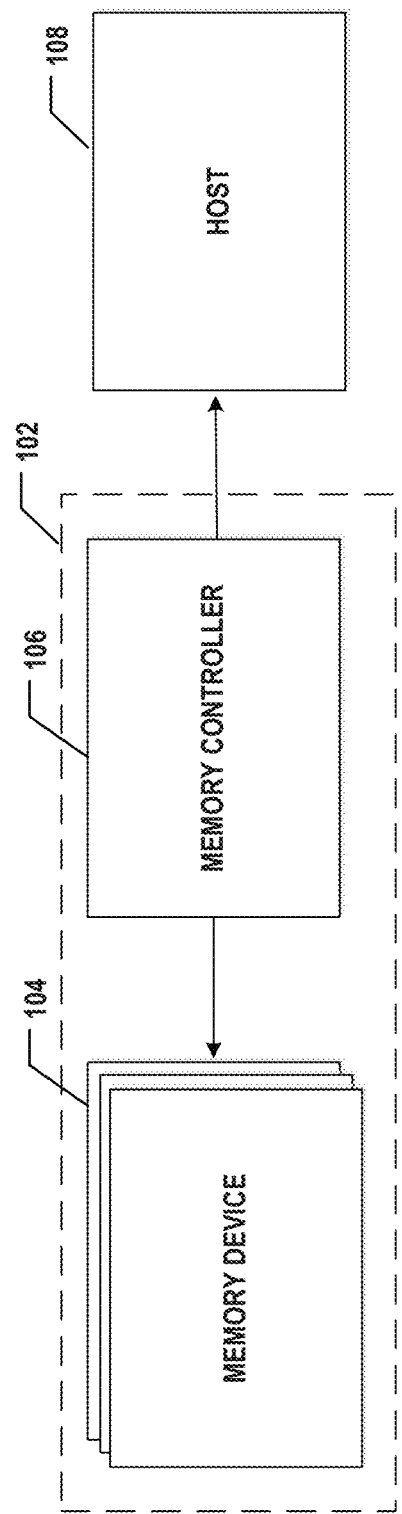
FIG. 1A illustrates a block diagram of an exemplary system having a memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As the demand for higher storage capacity, memory cells in NAND Flash memory devices are configured to be able to store more than 1 bit of memory data. A nLC NAND Flash cell can have $2^n$ states (e.g., ranges of charges) and can store n bit(s) of data. For example, a nLC NAND Flash cell that stores two ranges of charges is referred to as a 1-bit, 2-state (n=1) SLC cell; a nLC NAND Flash cell that stores four ranges of charges is referred to as a 2-bit, 4-state (n=2) MLC cell; a nLC NAND Flash cell that stores eight ranges of charges are referred to as a 3-bit, 8-state (n=3) TLC cell; and a nLC NAND Flash cell that stores sixteen ranges of charges are referred to as a 4-bit, 16-state (n=4) QLC cell. The $2^n$ states include 1 erased state and ($2^n-1$) programmed states. A block of nLC NAND Flash cells include memory cells formed by the intersection of word lines (e.g., gate conductive layers) and memory strings, and data is programmed/read from the nLC NAND Flash cells page by page. During a program operation, a nLC NAND Flash cell is programmed to have $2^n$ states, and n bits of data are written into the nLC NAND Flash cell as one of the states. For example, a QLC NAND Flash cell can store 4 bits of data respectively representing lower page data (LP), middle page data (MP), upper page data (UP), and extra page data (XP). In the NAND Flash memory device, each word line in a block is coupled to a plurality of pages of nLC NAND Flash cells such that one page of nLC NAND Flash cells can store n pages of data, e.g., 1 page for SLC NAND Flash cells, 2 pages for MLC NAND Flash cells, 3 pages for TLC NAND Flash cells, and 4 pages for QLC NAND Flash cells.

Before being programmed into a NAND Flash memory device, the data in the form of a binary-coded value is first translated/encoded using gray code translation/encoding to form a gray-coded programming value. A gray code is an encoding of numbers so that adjacent numbers have a single bit value differing by 1. Error correction can be easier using a gray-coded programming value in the program and read operations of a NAND Flash memory device. The gray-coded programming value can then be programmed into and read from the NAND Flash memory device. Specifically, for a QLC NAND Flash memory device, two schemes, an 8-16 scheme and a 16-16 scheme, can be used for program and read operations. According to the 8-16 scheme, the NAND Flash cells are first programmed to 8 intermediate levels in a coarse programming pass (e.g., a non-last programming pass), and then programmed to 16 levels (16 threshold voltage levels corresponding to the 16 states of a QLC NAND Flash cell) in a fine programming pass (e.g., the last programming pass). According to the 16-16 scheme, the NAND Flash cells are first programmed to 16 levels of broader distributions in a coarse programming pass, and then reprogrammed to 16 voltages levels of narrower distributions in a fine programming pass. To read the levels, respective read voltages are applied on the QLC NAND Flash cells to read the states and determine the state. The levels programmed using the two schemes are respectively readable to their read operations.

FIG. 6A illustrates a gray-code look-up table (LUT) used in a 16-16 scheme for the program and read operations of a QLC NAND Flash cell. FIG. 6B illustrates two gray-code LUTs used in a 8-16 scheme for the program and read operations of a QLC NAND Flash cell. Each of the LUTs depicts a mapping relationship between the states of the QLC NAND Flash cell and the mapping gray-coded programming values. As shown in FIGS. 6A and 6B, in the read operation, using the 16-16 scheme, the 4 bits of data are used to perform in both a coarse programming pass and a fine programming pass; using the 8-16 scheme, 3 bits of data is used to perform a coarse programming (as shown in LUT 1) and 4 bits of data is used to perform the fine programming (as shown in LUT 2). In the read operation, to read the states of the QLC NAND Flash cell, using the 16-16 scheme, reading each page data in each programming respectively requires 4, 4, 4, and 3 read times; using the 8-16 scheme, reading the extra page data in the fine programming requires 8 read times.

Comparing the 8-16 and 16-16 schemes, the 8-16 scheme is faster in programming but suffers from a smaller read margin and a longer read time because the read of the extra page data requires an undesirably high number of read operations; and the 16-16 scheme is slower for programming but has larger read margin and a shorter read time. The program operation and the read operation of QLC NAND Flash memory devices need to be improved.

The present disclosure provides a novel method for performing program and read operations in a memory device, the memory device, and a system thereof. The disclosed method is employed to combine a faster program operation and a faster read operation in operating a nLC NAND Flash memory device. According to the method, user data, e.g., a binary-coded value, is first translated to a first gray-coded programming value (e.g., a first value) that is readable using a first scheme in the read operation. The first scheme facilitates faster read operation. The first gray-coded programming value is then converted to a second gray-coded programming value (e.g., a second value) that corresponds to a second scheme facilitating faster program operation. The second gray-coded programming value is then programmed into and read from the nLC Flash memory device using the first scheme. The memory data read-out, in the form of a gray-coded read value, is the same as the first gray-coded programming value.

The conversion from the first gray-coded programming value to the second gray-coded programming value is based on a mapping relationship between a read gray code and a program gray code. The mapping relationship may be implemented between the mapping of the same state of a nLC NAND Flash cell or logic operations between gray-coded programming values. The first gray-coded programming value and the second gray-coded programming value may correspond to the same state of a nLC NAND Flash cell in the read gray code and the program gray code. In some implementations, a state mapped to the first gray-coded programming value in the read gray code can first be determined, and the second gray-coded programming value can then be determined by mapping the state with corresponding gray-coded values in the program gray code.

As an example, in a QLC NAND Flash memory device, a memory cell has 16 states corresponding to 16 ranges of charges. A QLC NAND Flash cell can store 4 bits of data which includes, respectively, lower page data (LP), middle page data (MP), upper page data (UP), and extra page data (XP). The four bits of data are first translated from a binary-coded value to a first gray-coded programming value, which is then converted to a second gray-coded programming value based on the mapping relationship between the read gray code and the program gray code. The second gray-coded programming value is programmed, as a level (e.g., a threshold voltage level or state), into one of the 16 ranges of charges using the 16-16 scheme. The level can be read out in the form of a gray-coded read value from the QLC NAND Flash cell using the 16-16 scheme. The gray-coded read value is the same as the first gray-coded programming value. In some embodiments, a conversion unit configured to perform the conversion between the first and second gray-coded programming values is a part of a peripheral circuit of the QLC NAND memory device. For example, the conversion unit can be part of control logic or a separate part of control logic. A data buffer coupled to the QLC NAND Flash memory cell is employed to buffer the 4 bits of data for both the program and read operations.

Compared to program and read operations using the same gray code, the disclosed method facilitates a combination of a "faster" program operation and a "faster" read operation. The total time for the read operation in a nLC NAND Flash memory cell, e.g., QLC NAND Flash memory cell, can be shortened/optimized. The performance of the nLC NAND Flash memory device can be improved.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Consistent with the scope of the present disclosure, memory controller 106 may translate a binary-coded value to a first gray-coded programming value. Memory device 104 (e.g., the peripheral circuits of memory device 104) may convert the first gray-coded programming value to a second gray-coded programming value. Memory controller 106 may control the program and read operations on memory device 104, e.g., through the peripheral circuits of memory device 104. In the program operation, the second gray-coded programming value is programmed into a memory cell in memory device 104 as a level representing one of the $2^n$ states of a memory cell (e.g., a nLC NAND Flash cell). In the read operation, states and the programmed level are read out. The gray-coded read value resulted from the read operation is the same as the first gray-coded programming value. While the program and read operations are performed using a first scheme (e.g. the 16-16 scheme) that has a shorter read time, the second gray-coded programming value corresponds to a second scheme (e.g. the 8-16 scheme) that has a shorter programming time. In some implementations, the program operation is performed using the second scheme (e.g., the 8-16 scheme), and the read operation is performed using the first scheme (e.g., the 16-16 scheme).

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, performing program and read operations on memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1C:
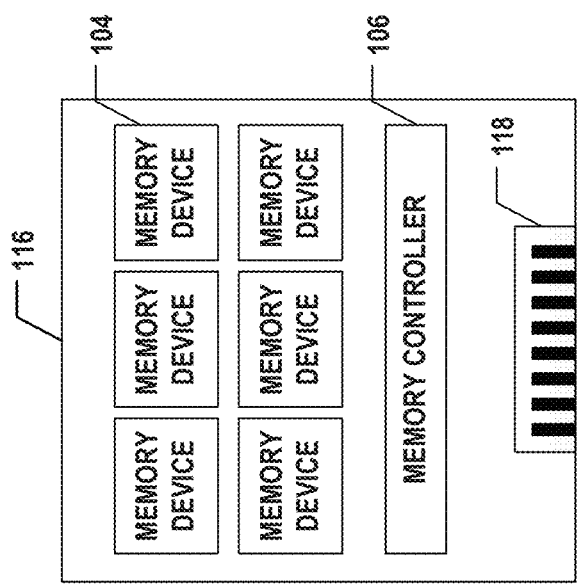
FIG. 1C illustrates a diagram of an exemplary solid-state drive (SSD) having a memory device, according to some aspects of the present disclosure.
Figure 1B:
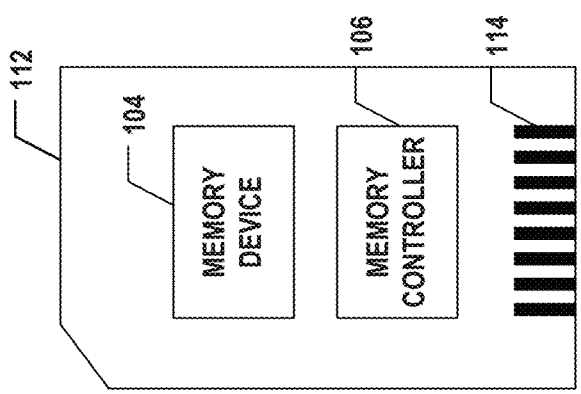
FIG. 1B illustrates a diagram of an exemplary memory card having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 2:
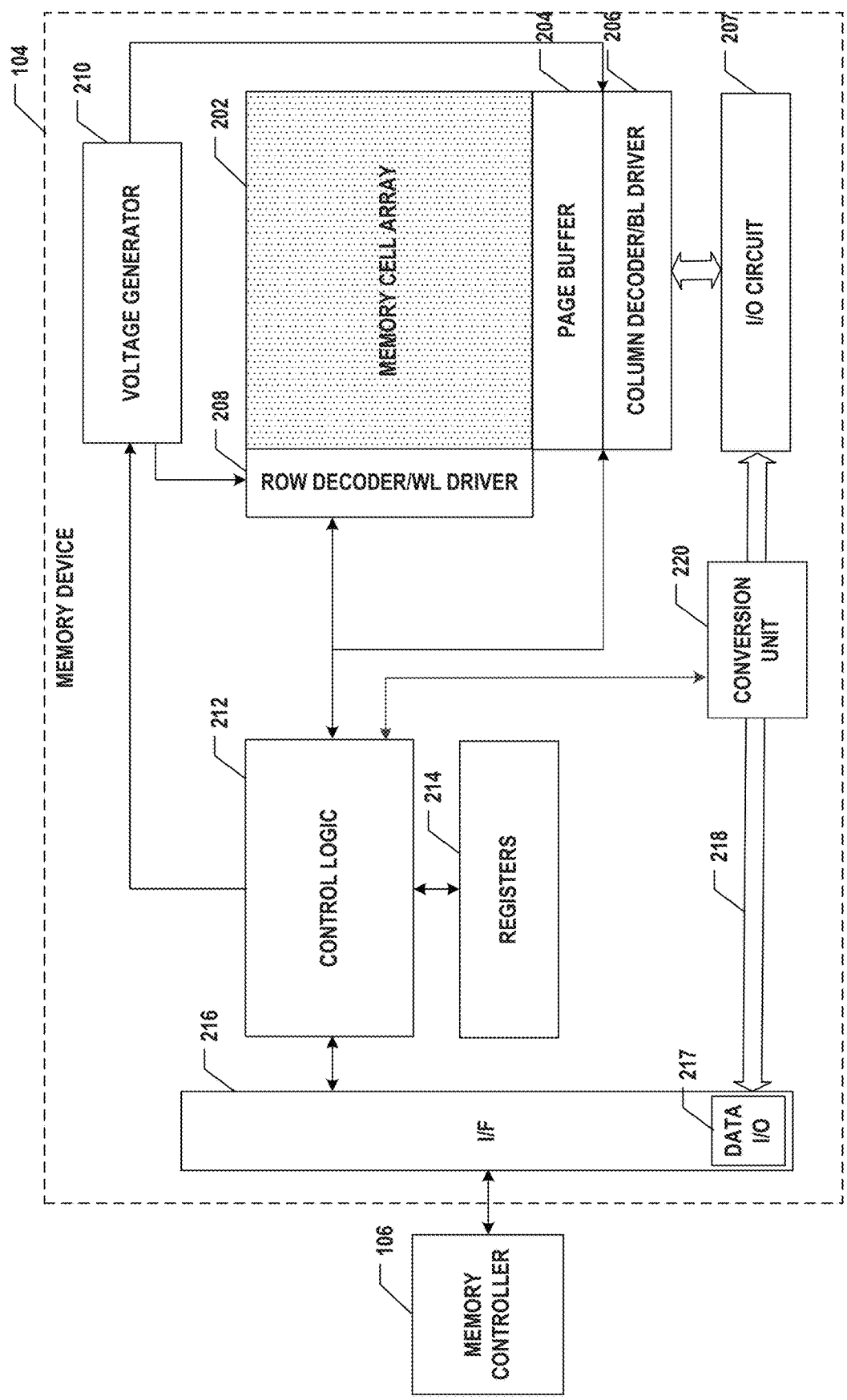
FIG. 2 illustrates a block diagram of an exemplary memory device including a memory cell array and peripheral circuits, according to some aspects of the present disclosure.
Figure 3:
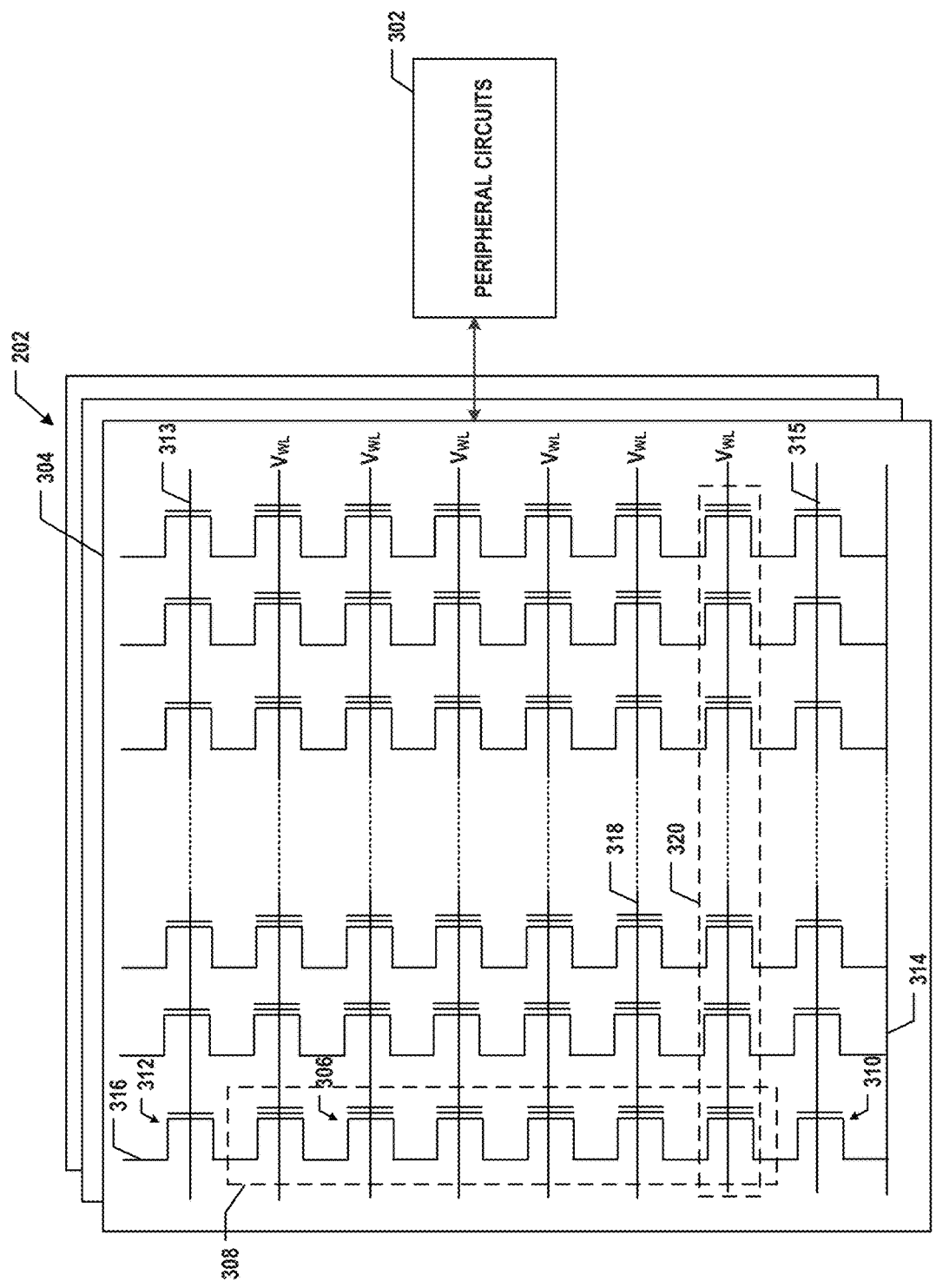
FIG. 3 illustrates a schematic circuit diagram of an exemplary memory device including peripheral circuits, according to some aspects of the present disclosure.

FIG. 2 illustrates a diagram of an exemplary memory device 104, e.g., a NAND Flash memory, having a memory cell array 202 and peripheral circuits including a page buffer 204, a column decoder/bit line driver 206, a row decoder/word line driver 208, a voltage generator 210, control logic 212, registers 214, and an interface 216. FIG. 3 illustrates a schematic circuit diagram of an exemplary memory device 104 including a memory cell array 202 and peripheral circuits 302 coupled to memory cell array 202. For ease of illustration, some components in FIGS. 2 and 3 are described together. Peripheral circuits 302 can include page buffer 204, column decoder/bit line driver 206, row decoder/ word line driver 208, voltage generator 210, control logic 212, registers 214, interface 216, and a conversion unit 220 in FIG. 2. It is understood that in some examples, additional peripheral circuits may be included as well.

As shown in FIG. 3, memory cell array 202 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is capable of storing more than a single bit of data in more than four memory states. For example, memory cell 306 can store two bits per cell (also known as multi-level cell (MLC)), three bits per cell (also known as triple-level cell (TLC)), or four bits per cell (also known as a quad-level cell (QLC)). Each memory cell 306 can be programmed to assume a range of possible levels. In one example, if each memory cell 306 stores two bits of data, then memory cell 306 can be programmed to assume one of three possible programming levels from an erased state by writing one of three possible levels to the cell. A fourth level can be used for the erased state. For ease of description, memory cell 306 may be represented as a nLC, n being the number of bits stored per cell and can be one of 1, 2, 3, 4, . . . , etc. As an example, in the present disclosure, n is equal to 4, and memory cell 306 is a QLC that has 16 states and can be programmed to store 16, i.e., $2^4$, levels.

Figure 5:
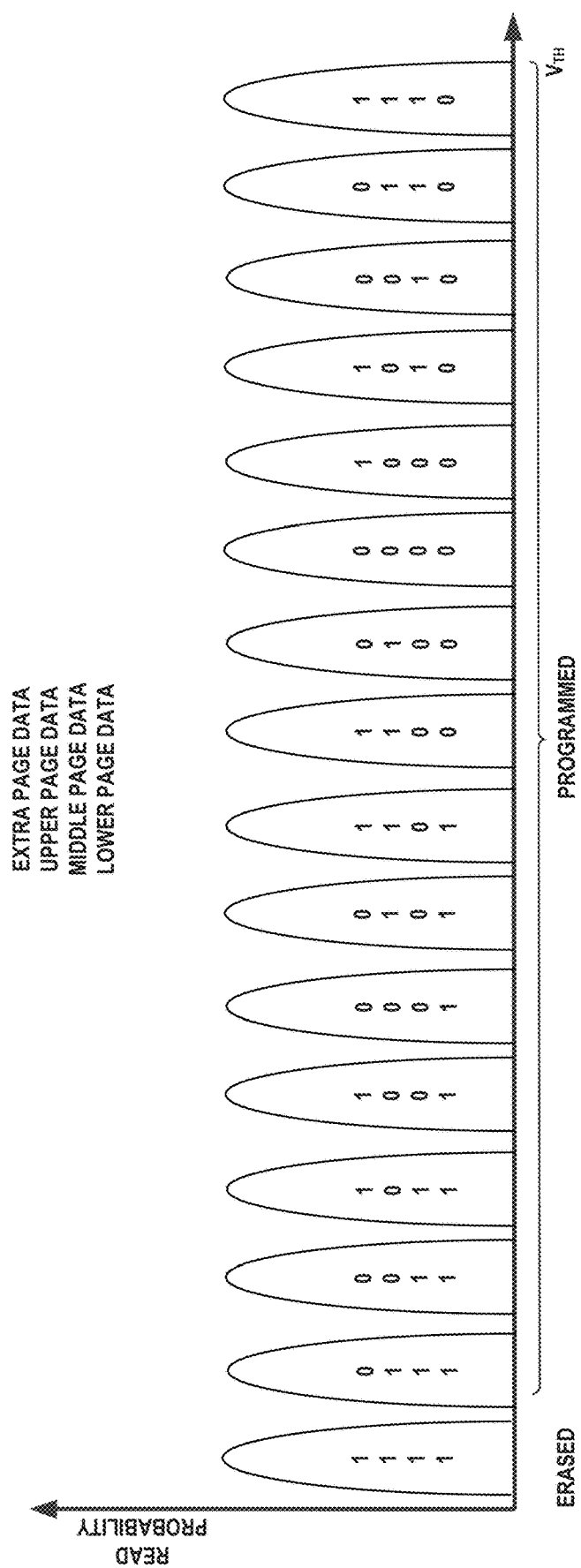
FIG. 5 illustrates 16 possible states in a quad-level cell (QLC), according to some aspects of the present disclosure.

FIG. 5 illustrates read probability versus bit value for read threshold voltages of memory cell 306, according to some implementations. As shown in FIG. 5, memory cell 306 can be programmed to have 16 states, which includes one erased state and 15 programmed states. Memory cell 306 can be programmed to a level representing one of the 16 states. The level can then be represented by 4 bits of page data, i.e., the lower page data, the middle page data, the upper page data, and the extra page data. For ease of illustration, in FIG. 5, the lower page data, the middle page data, the upper page data, and the extra page data are shown from the bottom to the top of each range of charges. In a program operation, the second gray-coded programming value, having the 4 bits of page data, may be programmed into one of the 16 states of memory cell 306. In a read operation, the 4 bits of page data may be read out.

As shown in FIG. 3, each NAND memory string 308 can include an SSG 310 at its source end and a DSG 312 at its drain end. SSG 310 and DSG 312 are respective the gate electrodes of an SSG transistor and a DSG transistor and can be configured to activate selected NAND memory strings 308 (columns of the array) during read and program operations. In some implementations, SSGs 310 of NAND memory strings 308 in the same block 304 are coupled through a same source line (SL) 314, e.g., a common SL, for example, to the ground. DSG 312 of each NAND memory string 308 is coupled to a respective bit line 316 from which data can be read via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can correspond to the number of NAND memory strings 308 coupled by word line 318 in one block 304. Each word line 318 can include a plurality of control gates (gate electrodes) at each memory cell 306 in respective page 320 and a gate line coupling the control gates.

Peripheral circuits 302 can be coupled to memory cell array 202 through bit lines 316, word lines 318, source lines 314, SSG lines 315, and DSG lines 313. Peripheral circuits 302 may apply voltages on bit lines 316, word lines 318, source lines 314, SSG lines 315, and DSG lines 313 to perform a program operation. As described above, peripheral circuits 302 can include any suitable circuits for facilitating the operations of memory cell array 202 by applying and sensing voltage signals and/or current signals through bit lines 316 to and from each target memory cell 306 through word lines 318, source lines 314, SSG lines 315, and DSG lines 313. Peripheral circuits 302 can include various types of peripheral circuits formed using metal-oxide-semiconductor (MOS) technologies.

Figure 4:
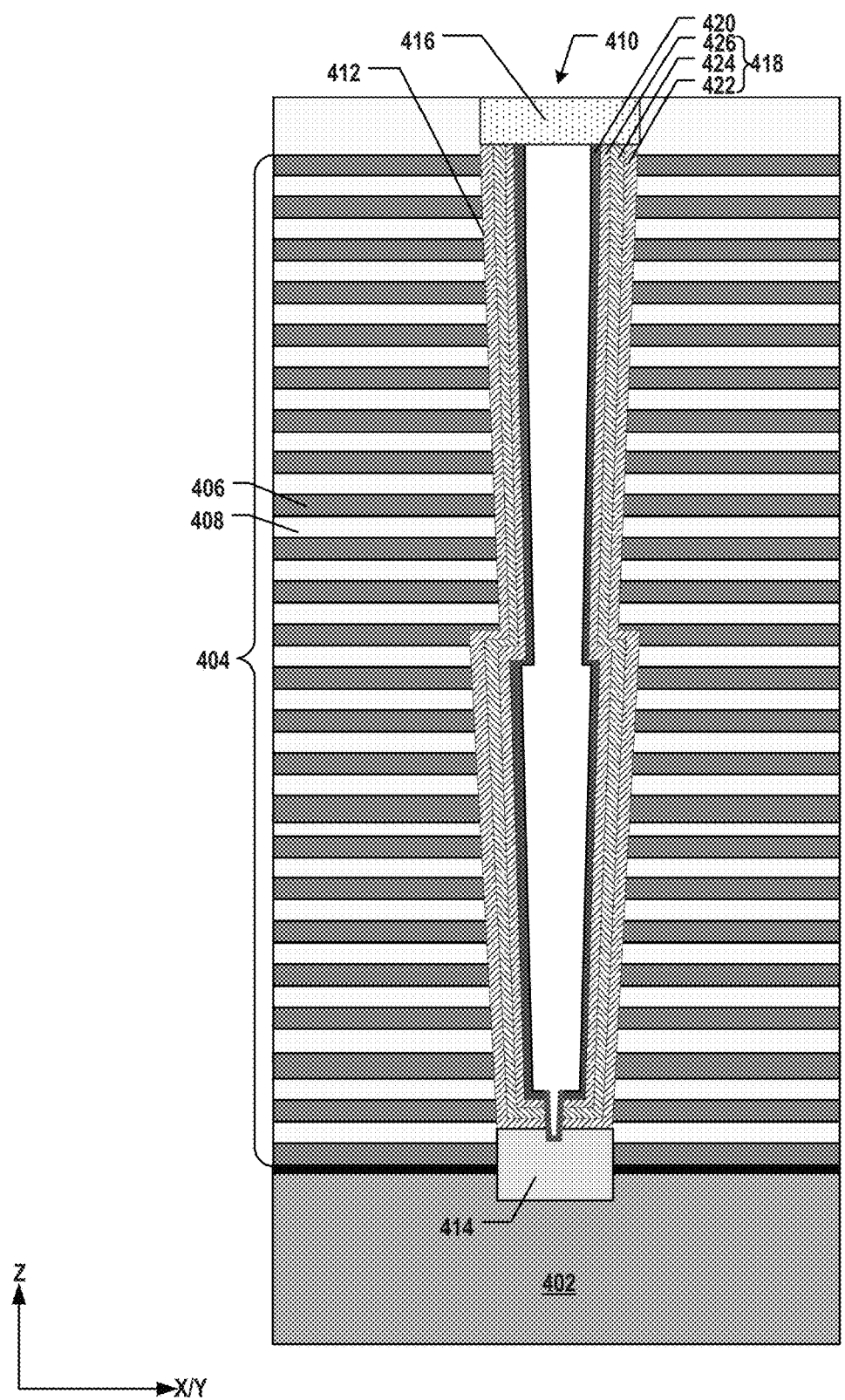
FIG. 4 illustrates a cross-section of an exemplary memory array device, according to some aspects of the present disclosure.

FIG. 4 illustrates a cross-section of an exemplary memory cell array 202, according to some aspects of the present disclosure. As shown in FIG. 4, memory cell array 202 includes a NAND memory string 410, which can be an example of a NAND memory string 308 in FIG. 3, extending vertically above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4 to further illustrate the spatial relationship of the components in memory cell array 202. Substrate 402 includes two lateral surfaces (e.g., a top surface and a bottom surface) extending laterally in the x-direction (i.e., the lateral direction). As used herein, whether one component is "on," "above," or "below" another component of a semiconductor structure (e.g., memory cell array 202) is determined relative to the substrate of the semiconductor structure (e.g., substrate 402) in the z-direction (i.e., the vertical direction or depth direction) when the substrate is positioned in the lowest plane of the semiconductor structure in the z-direction. The same notion for describing the spatial relationship is applied throughout the present disclosure.

As shown in FIG. 4, NAND memory string 410 extends vertically through a memory stack 404 having interleaved gate conductive layers 406 and gate-to-gate dielectric layers

408 above substrate 402. Gate conductive layers 406 and gate-to-gate dielectric layers 408 in memory stack 404 can alternate in the vertical direction. Each gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding the memory cells (e.g., memory cells 306 in FIG. 3), a DSG (e.g., DSG 312 in FIG. 3), or an SSG (e.g., SSG 310 in FIG. 3), and can extend laterally as a DSG line (e.g., DSG line 313 in FIG. 3) at the top of memory stack 404, an SSG line (e.g., SSG line 315 in FIG. 3) at the bottom of memory stack 404, or a word line between the DSG line and the SSG line (e.g., word lines 318 in FIG. 3).

As shown in FIG. 4, NAND memory string 410 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as amorphous silicon, polysilicon, or single crystalline silicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 can include a composite layer of silicon oxide/silicon oxynitride/silicon oxide (ONO).

In some implementations, NAND memory string 410 further includes a semiconductor plug 414 in the lower portion (e.g., at the lower end) of NAND memory string 410. Semiconductor plug 414 can include a semiconductor material, such as single-crystal silicon, which is epitaxially grown from substrate 402 in any suitable direction. Semiconductor plug 414 can function as part of the channel of a source-select transistor (e.g., the source-select transistor having SSG 310 in FIG. 3) of NAND memory string 410. In some implementations, NAND memory string 410 further includes a channel plug 416 in the upper portion (e.g., at the upper end) of NAND memory string 410. In some implementations, channel plug 416 can function as the channel of a drain select transistor (e.g., the drain select transistor having DSG 312 in FIG. 3) of NAND memory string 410. As used herein, the upper end of a component (e.g., channel structure 412) is the end farther away from substrate 402 in the z-direction, and the lower end of the component (e.g., channel structure 412) is the end closer to substrate 402 in the z-direction when substrate 402 is positioned in the lowest plane of memory cell array 202.

In a program operation, memory cells (e.g., memory cells 306) coupled to the same word line (e.g., word line 318) in a block may the applied with the same programming voltage/pulse and verify voltages. In some implementations, each NAND memory string 410 is applied with a respective voltage via the respective bit line (e.g., bit line 316) for program and read operations. To perform the program and read operations on NAND memory strings 410, control logic 212 may control each peripheral circuit 302 to apply respective voltages. The details are illustrated as follows.

Referring back to FIG. 2, page buffer 204 can be configured to read and program (write) data from and to memory cell array 202 according to the control signals from control logic 212. In one example, page buffer 204 may store program data (write data) to be programmed into one page 320 of memory cell array 202. In another example, page buffer 204 may perform program verify operations to ensure that the data has been properly programmed into memory cells 306 coupled to selected word lines 318. In still another example, page buffer 204 may also sense voltages from bit line 316 that represents a data bit stored in memory cell 306 and amplify the small voltage swing to recognizable logic levels in read operation. In some embodiments, each NAND memory string 410 is coupled to a page buffer 204, which can include a plurality of latches for buffering data to and from memory cells in each NAND memory string 410. For example, each NAND memory string 410 may be coupled to 4 latches for buffering 4 bits of data to and from memory cell 306 in NAND memory string 410.

Column decoder/bit line driver 206 can be configured to be controlled by control logic 212 and select one or more NAND memory strings 410 by applying bit line voltages generated from voltage generator 210. Row decoder/word line driver 208 can be configured to be controlled by control logic 212 and select block 304 of memory cell array 202 and a word line 318 of selected block 304. Row decoder/word line driver 208 can be further configured to drive the selected word line 318 using a word line voltage generated from voltage generator 210. Voltage generator 210 can be configured to be controlled by control logic 212 and generate the word line voltages (e.g., read voltage, program voltage, pass voltage, local voltage, and verification voltage) to be supplied to memory cell array 202. In some embodiments, controlled by control logic 212, row decoder/word line driver 208 applies programming voltages/pulses on selected word line 318 based on the second gray-coded programming value buffered in page buffer 204.

Optionally, memory device 104 includes an input/output (I/O) circuit 207 coupled to conversion unit 220 and page buffer 204 (and/or column decoder/bit line driver 206). Data from I/F 216 may be routed into page buffer 204 directly or via I/O circuit 207. In some implementations, I/O circuit 207 can direct the data input from data bus 218 to the desired memory cell areas of memory cell array 202, as well as the data output from the desired memory cell areas to data bus 218.

Conversion unit 220 may include any suitable circuitry and/or firmware/software configured to convert the first gray-coded programming value to the second gray-coded programming value. In one example, conversion unit 220 may be implemented by dedicated integrated circuits, for example, application-specific integrated circuits (ASICs). In another example, conversion unit 220 may be implemented by firmware/software codes running on a processor, for example, a microcontroller unit (MCU). Conversion unit 220 may be controlled by control logic 212. Conversion unit 220 may be part of (e.g., inside) control logic 212, or may be a separate part from control logic 212. As an example in the present disclosure, conversion unit 220 is depicted as a separate part of control logic 212. Conversion unit 220 may also be coupled to I/F 216 and page buffer 204. Data to be programmed into memory cell array 202 may be inputted to conversion unit 220 via data bus 218 from I/F 216. After being converted, the data to be programmed may be outputted by conversion unit 220 and buffered into page buffer 204 via data bus 218 (and I/O circuit 207, if any). Data read out from memory cell array 202 may be buffered into page buffer 204, and further to I/F 216 via data bus 218.

In some embodiments, memory controller 106 may translate data to be programmed, e.g., user data, from a binary-coded value to a first gray-coded programming value. Conversion unit 220 may receive the first gray-coded programming value via data bus 218 and convert the first gray-coded programming value to a second gray-coded programming value. Page buffer 204 may buffer the second gray-coded programming value before outputting it to memory cell array 202. In a program operation, row decoder/word line driver 208 may apply programming voltages/pulses on selected word line 318 to program the second gray-coded programming value into memory cells 306 in page 320. Each memory cell 306 in page 320 may thus be programmed to a respective level/state. In a read operation, row decoder/word line driver 208 and column decoder/bit line driver 206 may apply respective voltages on memory cells 306 in page 320 to read out the levels. The levels may be read out as a gray-coded read value. Page buffer 204 may buffer the gray-coded read value before outputting it to I/F 216. In some embodiments, the gray-coded read value is the same as the first gray-coded programming value.

As previously described, the first gray-coded programming value corresponds to a first scheme of a higher read speed, and the second gray-coded programming value corresponds to a second scheme of a higher program speed. In some embodiments, memory cell 306 is a QLC having 16 states, the first scheme is a 16-16 scheme, and the second scheme is an 8-16 scheme. As shown in FIGS. 6A and 6B, each of the gray codes depicts the 16 states of a memory cell and the mapping gray-coded value, e.g., having 4 bits of data. For example, state 2 is mapped to gray-coded value 0110 based on the first gray code shown in FIG. 6A and is mapped to gray-coded value 0110 based on the second gray code shown in LUT 2 in FIG. 6B. In the present disclosure, the first gray code can also be referred to as a read gray code, and the second gray code can also be referred to as a program gray code.

Various ways can be employed to convert the first gray-coded programming value to the second gray-coded programming value for memory cell 306 (e.g., a QLC) by conversion unit 220. In some implementations, after receiving the first gray-coded programming value of four pages (e.g., the 4 bits respectively being the lower page data, middle page data, upper page data, and extra page data), conversion unit 220 determines the state of the first gray-coded programming value according to the first gray code, e.g., using the LUT in FIG. 6A. Conversion unit 220 may then determine the gray-code value mapped to the determined state using LUT 2 in FIG. 6B. The gray-code value may form the second gray-coded programming value. The second gray-coded programming value may then be programmed into memory cells 306 using a 16-16 scheme in a program operation. That is, row decoder/word line drivers 208 may apply programming voltages/pulses on selected word line 318 to perform a coarse programming to program memory cell 306 to 16 states of broader distribution, and a subsequent fine programming to program memory cell 306 to 16 states of narrower distribution. The second gray-coded programming value having the 4 bits of data can be programmed into one of the 16 states as a level. In a read operation, the level is read out using the 16-16 scheme. The gray-coded read value resulted from the read operation is the same as the first gray-coded programming value.

In an example, first gray-coded programming value [1011] of one memory cell 306, may be inputted into conversion unit 220 by data bus 218. Conversion unit 220 may first determine the state of memory cell 306 corresponding to [1011] based on the LUT in FIG. 6A. The state is determined to be "11". Conversion unit 220 may then determine the gray-coded value mapped to state "11" in LUT 2 in FIG. 6B. As shown in FIGS. 6A and 6B, state "11" corresponds to [1101], which is then determined to be the second gray-coded programming value. The second gray-coded programming value is then programmed into memory cell 306 as a level using a 16-16 scheme in a program operation. In a read operation, the levels are read out using the 16-16 scheme. The gray-coded read value resulted from the read operation is [1011].

In another example, the second gray-coded programming value is programmed into memory cell 306 as the level using a 8-16 scheme in a program operation. In some implementations, conversion unit 220 may determine the gray-coded value corresponding to state "11" in LUT 1, e.g., state "5" in this example, and program [110] into memory cell 306 using a coarse programming pass (e.g., a first pass). Conversion unit 220 may further program [1101] to memory cell 306 using a fine coarse programming pass (e.g., a second pass). In a read operation, the levels are read out using the 16-16 scheme. The gray-coded read value resulted from the read operation is [1011]. In other various implementations, the second gray-coded programming value is programmed into memory cell 306 using other schemes with desirably fast speed in a program operation.

In some implementations, conversion unit 220 converts the first gray-coded programming value to the second gray-coded programming value based on a logic algorithm. For example, for one memory cell 306, the first gray-coded programming value is represented as $A_0A_1A_2A_3$, in which each of $A_0$, $A_1$, $A_2$, and $A_3$ each represents a bit value of a different one of the lower page data, middle page data, upper page data, and the extra page data. The second gray-coded programming value is represented as $B_0B_1B_2B_3$, in which each of $B_0$, $B_1$, $B_2$, and $B_3$ each represents a bit value of a different one of the lower page data, middle page data, upper page data, and the extra page data. For ease of illustration, $A_n$ and $B_n$ represent the bit values of the same page, n being 0, 1, 2, 3. Conversion unit 220 may determine $B_0$ to be equal to $A_0 \oplus (A_1 \oplus A_2 \oplus A_3) \oplus (B_1 \oplus B_2 \oplus B_3)$. For example, if $A_0$ represents the bit value of the upper data page in the first gray-coded programming value, then $B_0$ represents the bit value of the upper data page in the second gray-coded programming value. The bit value of $B_0$ may be determined by performing an exclusive or operation amongst $A_0$, a value of an exclusive or operation amongst the bit values of the lower page data, the middle page data, and the extra page data in the first gray-coded programming value, and a value of an exclusive or operation amongst the bit values of the lower page data, the middle page data, and the extra page data in the second gray-coded programming value.

In some embodiments, page buffer 204 stores the bits of all pages, e.g., 4 bits for all four page data, to be programmed and read out. In some embodiments, in a program operation, page buffer 204 buffers the 4 bits of second gray-coded programming value from I/O circuit 207 and outputs the second gray-coded programming value to memory cell 306 in page 320 being programmed, before the 4 bits of second gray-coded programming value for the next memory cell 306 is buffered in. In some embodiments, in a read operation, page buffer 204 buffers the 4 bits of gray-coded read value read from memory cell 306 in page 320 and outputs the gray-coded read value to I/O circuit 207 before the 4 bits of gray-coded read value for the next memory cell 306 is buffered in.

Control logic 212 can be coupled to each peripheral circuit described above and configured to control the operations of each peripheral circuit. Registers 214 can be coupled to control logic 212 and include status registers, command registers, and address registers for storing status information, command operation codes (OP codes), and command addresses for controlling the operations of each peripheral circuit. Interface 216 can be coupled to control logic 212 and act as a control buffer to buffer and relay control commands received from a host (not shown) to control logic 212 and status information received from control logic 212 to the host. Interface 216 can also be coupled to I/O circuit 207 via data bus 218 and act as a data I/O interface and a data buffer to buffer and relay the write data received from a host (not shown) to I/O circuit 207 and the read data from I/O circuit 207 to the host. For example, interface 216 may include a data I/O 217 coupled to data bus 218.

Figure 7:
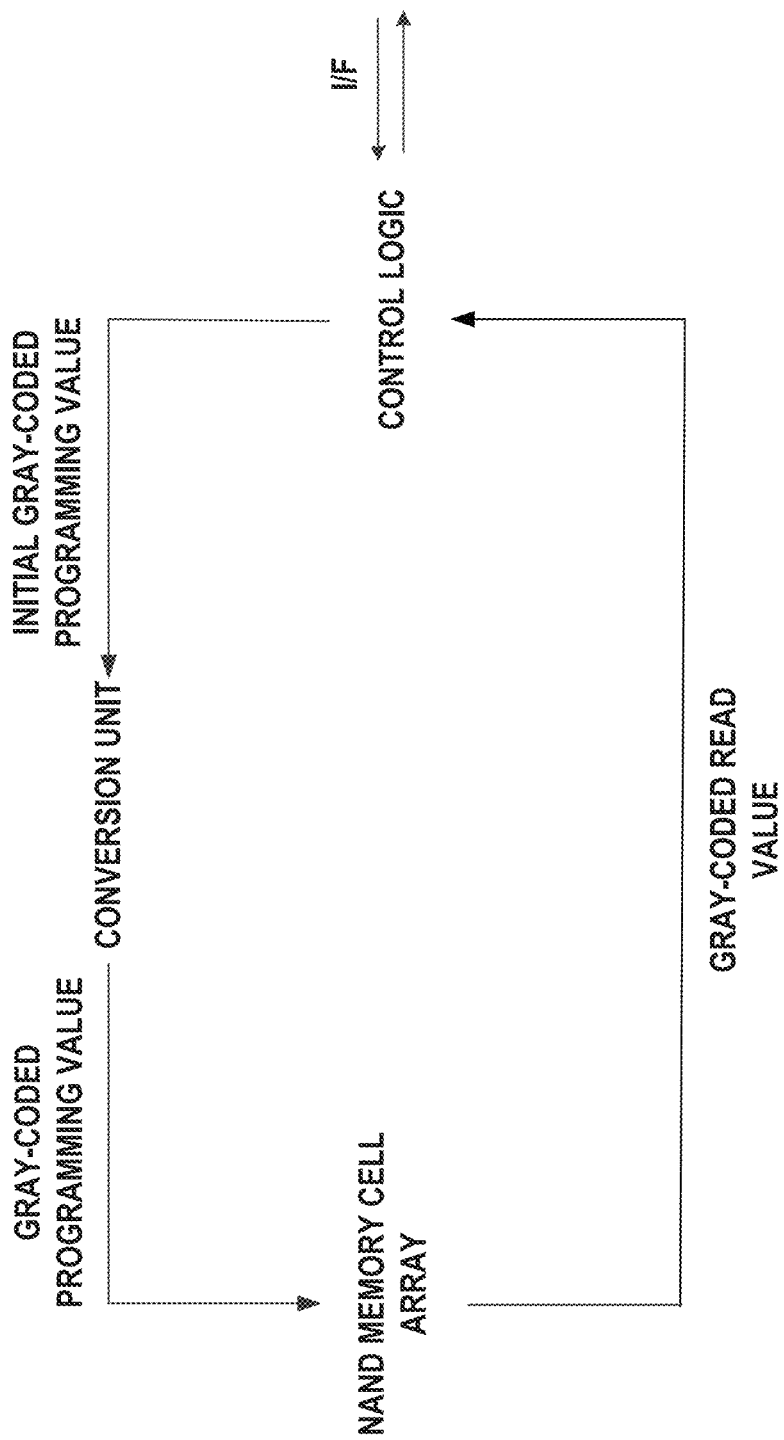
FIG. 7 illustrates an exemplary conversion process, according to some aspects of the present disclosure.
Figure 8:
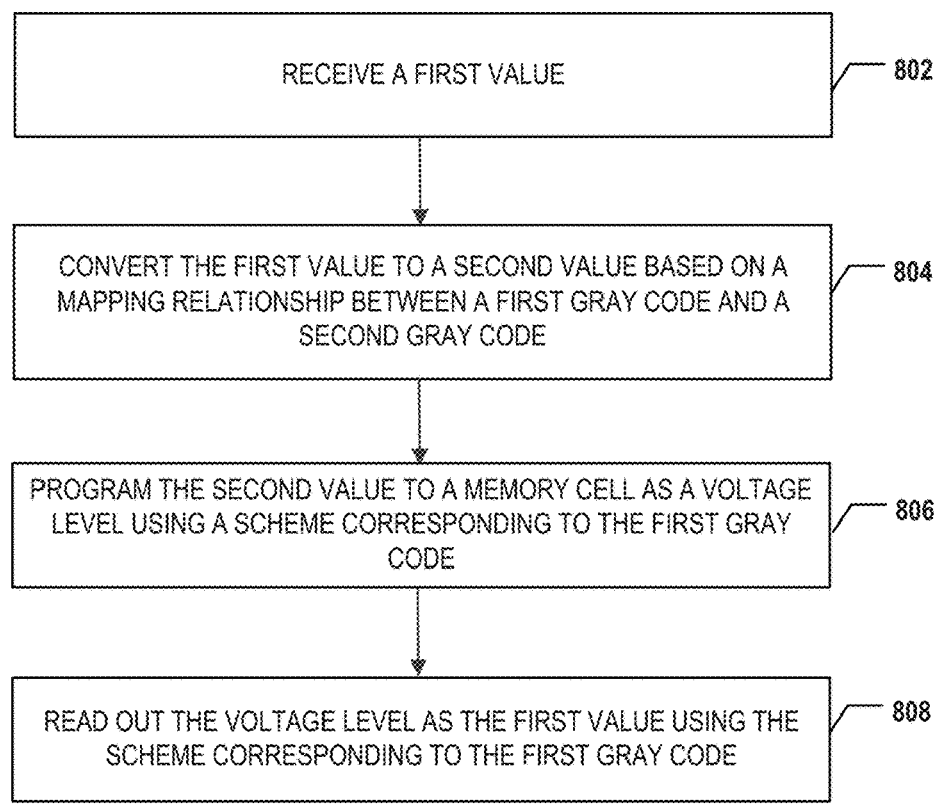
FIG. 8 illustrates a flowchart of an exemplary method for performing a program operation and a read operation, according to some aspects of the present disclosure.

FIG. 7 illustrates a diagram showing certain elements employed in a program operation and a read operation, according to some implementations. FIG. 8 is a flowchart of an exemplary method 800 for operating a memory device to perform a program operation and a read operation, according to some implementations of the present disclosure. Examples of the memory device depicted in FIG. 8 include memory devices 104 depicted in FIG. 1A. For ease of illustration, FIG. 8 may be described in view of operations illustrated in FIGS. 2, 3, 6A, 6B, and 7. It is understood that the operations shown in method 800 are not exhaustive and that other operations can be performed as well before, after, or between any of the illustrated operations. Further, some of the operations may be performed simultaneously, or in a different order than shown in FIG. 8. In some implementations, method 800 is performed by peripheral circuits 302. Specifically, the word line driver (e.g., 208) may be configured to apply voltages on the word lines, the DSG line, and the SSG line, and bit line driver (e.g., 206) may be configured to apply voltages on the bit lines.

Referring to FIG. 8, method 800 starts at operation 802, in which a first value is received. This operation may be performed by a conversion unit, e.g., 220, controlled by a control logic e.g., 212. As shown in FIG. 7, the first value, e.g., the first gray-coded programming value illustrated in FIGS. 2 and 3, may be received by the conversion unit. The first value may be routed from an I/F of the memory device, e.g., I/F 216, and the receiving of the first value may be controlled by the control logic. The first value can be translated from a binary-coded value before being received by the conversion unit or I/F.

Referring back to FIG. 8, method 800 proceeds to operation 804, in which first value is converted to a second value. This operation may be performed by the conversion unit controlled by the control logic. As shown in FIG. 7, the second value, e.g., the second gray-coded programming value illustrated in FIGS. 2 and 3, can be generated by the conversion unit. The second value may be converted from the first value based on a mapping relationship between the first gray code and a second gray code. The first and second values map to the same state of a memory cell in both the first and second gray codes. In some implementations, the first gray code corresponds to a first scheme, and the second gray code corresponds to a second scheme. The conversion of the second value from the first value may be referred to the descriptions of FIGS. 2, 3, 6A, and 6B, and is not repeated herein.

Referring back to FIG. 8, method 800 proceeds to operation 806, in which the second value is programmed into a memory cell in a memory cell array using the first scheme. This operation may be performed by a row decoder/word line driver (e.g., 208), a column decoder/bit line driver (e.g., 206), and a page buffer (e.g., 204), each controlled by the control logic. The memory cell may be programmed into $2^n$ states, n being 1, 2, 3, 4, . . . , etc. The second may be programmed into the one of the states as a level using the first scheme such that the level is readable using the same scheme in a subsequent read operation. The program operation may be referred to the descriptions of FIGS. 2, 3, 6A, and 6B, and is not repeated herein.

Referring back to FIG. 8, method 800 proceeds to operation 808, in which the level in the memory cells is read out using the first scheme. This operation may be performed by the row decoder/word line driver, the column decoder/bit line driver, and the page buffer, each controlled by the control logic. The level is read out using the first scheme. The read-out value is the first value. The read operation may be referred to the descriptions of FIGS. 2, 3, 6A, and 6B, and is not repeated herein.

One aspect of the present disclosure provides a memory device. The memory device includes an array of memory cells arranged in a plurality of rows, a plurality of word lines respectively coupled to the plurality of rows of the memory cells, and a peripheral circuit coupled to the word lines. The peripheral circuit is configured to convert a first value to a second value based on a mapping relationship between a read gray code and a program gray code, perform a program operation to program the second value into a memory cell as a state based on the read gray code, and perform a read operation to read out the state from the memory cell based on the read gray code to be the first value.

In some implementations, the peripheral circuit includes a conversion unit configured to convert the first value to the second value. Each of the read and program gray codes includes a plurality of states of the memory cell and respective mapping gray-coded values. The first value and the second value are mapped to a same state of the memory cell in the read and program gray codes.

In some implementations, the peripheral circuit includes control logic coupled to the conversion unit and a word line driver coupled to the control logic and the plurality of word lines. The control logic is configured to generate a plurality of control signals based on the second value and the first value, respectively. The word line driver is configured to apply word line voltages on a row of the word lines coupled to the memory cell based on the plurality of control signals to perform the program operation and the read operation, respectively.

In some implementations, the memory cell is configured to store N bits of data of N pages; and the gray-coded programming value includes the N bits of data.

In some implementations, the memory device further includes a memory string in which the memory cell is in. The peripheral circuit includes a page buffer coupled to the memory string, a bit line coupled to the page buffer and the memory string, and a bit line driver coupled to the bit line and a control logic. To perform the program operation, the page buffer is configured to buffer the N bits of data, the bit line driver is configured to select the memory string, and the word line driver is configured to apply a program voltage on a row of word lines based on the N bits of data. To perform the read operation, the bit line driver is configured to select the memory string, the word line driver is configured to apply a read voltage on the row of word lines based on the N bits of data, and the page buffer is configured to buffer the N bits of data.

In some implementations, the read and program gray codes each includes a loo-up table that respectively includes a mapping relationship between the plurality of states of the memory cell and respective gray-coded values. In some implementations, the conversion unit is configured to receive the first value, determine the state corresponding to the first value based on the read gray code, and determine one gray-coded value mapped to the state based on the program gray code, the one gray-coded value being the second value.

In some implementations, the first value includes N bits of data of N pages, and the conversion unit is configured to convert one bit in the first value to a respective bit in the second value by, perform an exclusive or (XOR) operation amongst (N−1) bits representing (N−1) pages in the first value to obtain a first XOR value; perform an XOR operation amongst (N−1) bits representing (N−1) pages in the second value to obtain a second XOR value; and perform an XOR operation amongst the one bit in the first value, the first XOR value, and the second XOR value, to obtain the respective bit in the second value.

In some implementations, the conversion unit is a part of the control logic.

In some implementations, the conversion unit is a separate part of the control logic and is between a data interface of the peripheral circuit and a page buffer of the memory cell.

In some implementations, the memory cell is a QLC having 16 states and configured to store 4 bits of data of 4 pages.

Another aspect of the present disclosure provides a method for operating a memory device that includes an array of memory cells arranged in a plurality of rows and a plurality of word lines respectively coupled to the plurality of rows of the memory cells. The method includes converting a first value to a second value based on a mapping relationship between a read gray code and a program gray code, performing a program operation to program the second value into a memory cell as a state based on the read gray code, and performing a read operation to read out the state from the memory cell based on the read gray code to be the first value.

In some implementations, each of the read and program gray codes includes a plurality of states of the memory cell and respective mapping gray-coded values. In some implementations, converting the first value to the second value includes mapping the first value and the second value to a same state of the memory cell in the read and program gray codes.

In some implementations, the method further includes generating a plurality of control signals based on the second value and the first value, respectively. In some implementations, the method also includes applying word line voltages on a row of the word lines coupled to the memory cell based on the plurality of control signals to perform the program operation and the read operation, respectively.

In some implementations, the memory cell is configured to store N bits of data of N pages, and the gray-coded programming value includes the N bits of data.

In some implementations, the memory device further includes a memory string in which the memory cell is in.

The method further includes, to perform the program operation, buffering the N bits of data, selecting the memory string, and applying a program voltage on a row of word lines based on the N bits of data. The method also includes, to perform the read operation, selecting the memory string, applying a read voltage on the row of word lines based on the N bits of data, and buffering the N bits of data.

In some implementations, the read and program gray codes each includes a loo-up table that respectively includes a mapping relationship between the plurality of states of the memory cell and respective gray-coded values. In some implementations, the method includes receiving the first value, determining the state corresponding to the first value based on the read gray code, and determining one gray-coded value mapped to the state based on the program gray code, the one gray-coded value being the second value.

In some implementations, the first value includes N bits of data of N pages. In some implementations, the method includes converting one bit in the first value to a respective bit in the second value by, performing an exclusive or (XOR) operation amongst (N−1) bits representing (N−1) pages in the first value to obtain a first XOR value, performing an XOR operation amongst (N−1) bits representing (N−1) pages in the second value to obtain a second XOR value, and performing an XOR operation amongst the one bit in the first value, the first XOR value, and the second XOR value, to obtain the respective bit in the second value.

In some implementations, the memory cell is a QLC having 16 states and configured to store 4 bits of data of 4 pages.

Another aspect of the present disclosure provides a system. The system includes an array of memory cells arranged in a plurality of rows, a plurality of word lines respectively coupled to the plurality of rows of the memory cells, and a peripheral circuit coupled to the word lines. The peripheral circuit is configured to convert a first value to a second value based on a mapping relationship between a read gray code and a program gray code, perform a program operation to program the second value into a memory cell as a state based on the read gray code, and perform a read operation to read out the state from the memory cell based on the read gray code to be the first value. The system also includes a memory controller coupled to the memory device and configured to control the memory device.

In some implementations, the system further includes a host coupled to the memory controller.

In some implementations, the peripheral circuit includes a conversion unit configured to convert the first value to the second value. In some implementations, each of the read and program gray codes includes a plurality of states of the memory cell and respective mapping gray-coded values, and the first value and the second value are mapped to a same state of the memory cell in the read and program gray codes.

In some implementations, the peripheral circuit includes control logic coupled to the conversion unit and a word line driver coupled to the control logic and the plurality of word lines. In some implementations, the control logic is configured to generate a plurality of control signals based on the second value and the first value, respectively. In some implementations, the word line driver is configured to apply word line voltages on a row of the word lines coupled to the memory cell based on the plurality of control signals to perform the program operation and the read operation, respectively.

In some implementations, the memory cell is configured to store N bits of data of N pages, and the gray-coded programming value includes the N bits of data.

In some implementations, the system further includes a memory string in which the memory cell is in. The peripheral circuit includes a page buffer coupled to the memory string, a bit line coupled to the page buffer and the memory string, and a bit line driver coupled to the bit line and a control logic. In some implementations, to perform the program operation, the page buffer is configured to buffer the N bits of data, the bit line driver is configured to select the memory string, and the word line driver is configured to apply a program voltage on a row of word lines based on the N bits of data. In some implementations, to perform the read operation, the bit line driver is configured to select the memory string, the word line driver is configured to apply a read voltage on the row of word lines based on the N bits of data, and the page buffer is configured to buffer the N bits of data.

In some implementations, the read and program gray codes each includes a loo-up table that respectively includes a mapping relationship between the plurality of states of the memory cell and respective gray-coded values. In some implementations, the conversion unit is configured to receive the first value, determine the state corresponding to the first value based on the read gray code, and determine one gray-coded value mapped to the state based on the program gray code, the one gray-coded value being the second value.

In some implementations, the first value includes N bits of data of N pages. In some implementations, the conversion unit is configured to convert one bit in the first value to a respective bit in the second value by, perform an exclusive or (XOR) operation amongst (N−1) bits representing (N−1) pages in the first value to obtain a first XOR value, perform an XOR operation amongst (N−1) bits representing (N−1) pages in the second value to obtain a second XOR value, and perform an XOR operation amongst the one bit in the first value, the first XOR value, and the second XOR value, to obtain the respective bit in the second value.

In some implementations, the conversion unit is a part of the control logic.

In some implementations, the conversion unit is a separate part of the control logic and is between a data interface of the peripheral circuit and a page buffer of the memory cell.

In some implementations, the memory cell is a QLC having 16 states and configured to store 4 bits of data of 4 pages.

In some implementations, the memory controller is coupled to the peripheral circuit and is configured to translate a binary-coded value to the first value.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
    an array of memory cells arranged in a plurality of rows;
    a plurality of word lines respectively coupled to the plurality of rows of the memory cells; and
    a peripheral circuit coupled to the word lines configured to:
        convert a first value to a second value based on a mapping relationship between a read gray code and a program gray code,
        perform a program operation to program the second value into a memory cell as a state based on the read gray code, and
        perform a read operation to read out the state from the memory cell based on the read gray code to be the first value.

2. The memory device of claim 1, wherein the peripheral circuit comprises a conversion unit configured to convert the first value to the second value, wherein:
    each of the read and program gray codes comprises a plurality of states of the memory cell and respective mapping gray-coded values; and
    the first value and the second value are mapped to a same state of the memory cell in the read and program gray codes.

3. The memory device of claim 2, wherein the peripheral circuit comprises control logic coupled to the conversion unit and a word line driver coupled to the control logic and the plurality of word lines, and wherein:
    the control logic is configured to generate a plurality of control signals based on the second value and the first value, respectively, and
    the word line driver is configured to apply word line voltages on a row of the word lines coupled to the memory cell based on the plurality of control signals to perform the program operation and the read operation, respectively.

4. The memory device of claim 1, wherein:
    the memory cell is configured to store N bits of data of N pages; and
    the gray-coded programming value comprises the N bits of data.

5. The memory device of claim 4, further comprising a memory string in which the memory cell is in, wherein the peripheral circuit comprises a page buffer coupled to the memory string, a bit line coupled to the page buffer and the memory string, and a bit line driver coupled to the bit line and a control logic, and wherein:
    to perform the program operation, the page buffer is configured to buffer the N bits of data, the bit line driver is configured to select the memory string, and the word line driver is configured to apply a program voltage on a row of word lines based on the N bits of data; and
    to perform the read operation, the bit line driver is configured to select the memory string, the word line driver is configured to apply a read voltage on the row of word lines based on the N bits of data, and the page buffer is configured to buffer the N bits of data.

6. The memory device of claim 2, wherein:
    the read and program gray codes each comprises a loo-up table that respectively comprises a mapping relationship between the plurality of states of the memory cell and respective gray-coded values; and
    the conversion unit is configured to:
        receive the first value;
        determine the state corresponding to the first value based on the read gray code; and
        determine one gray-coded value mapped to the state based on the program gray code, the one gray-coded value being the second value.

7. The memory device of claim 2, wherein the first value comprises N bits of data of N pages, and the conversion unit is configured to convert one bit in the first value to a respective bit in the second value by:

perform an exclusive or (XOR) operation amongst (N−1) bits representing (N−1) pages in the first value to obtain a first XOR value;

perform an XOR operation amongst (N−1) bits representing (N−1) pages in the second value to obtain a second XOR value; and perform an XOR operation amongst the one bit in the first value, the first XOR value, and the second XOR value, to obtain the respective bit in the second value.

8. The memory device of claim 3, wherein the conversion unit is a part of the control logic.

9. The memory device of claim 3, wherein
the conversion unit is a separate part of the control logic and is between a data interface of the peripheral circuit and a page buffer of the memory cell.

10. The memory device of claim 1, wherein the memory cell is a quad-level cell (QLC) comprising 16 states and configured to store 4 bits of data of 4 pages.

11. A method for operating a memory device that comprises an array of memory cells arranged in a plurality of rows and a plurality of word lines respectively coupled to the plurality of rows of the memory cells, the method comprising:

converting a first value to a second value based on a mapping relationship between a read gray code and a program gray code, performing a program operation to program the second value into a memory cell as a state based on the read gray code, and performing a read operation to read out the state from the memory cell based on the read gray code to be the first value.

12. The method of claim 11, wherein each of the read and program gray codes comprises a plurality of states of the memory cell and respective mapping gray-coded values, and converting the first value to the second value comprises:

mapping the first value and the second value to a same state of the memory cell in the read and program gray codes.

13. The method of claim 12, further comprising:
generating a plurality of control signals based on the second value and the first value, respectively, and
applying word line voltages on a row of the word lines coupled to the memory cell based on the plurality of control signals to perform the program operation and the read operation, respectively.

14. The method of claim 11, wherein:
the memory cell is configured to store N bits of data of N pages; and
the gray-coded programming value comprises the N bits of data.

15. The method of claim 14, the memory device further comprising a memory string in which the memory cell is in, the method further comprising:

to perform the program operation, buffering the N bits of data, selecting the memory string, and applying a program voltage on a row of word lines based on the N bits of data; and to perform the read operation, selecting the memory string, applying a read voltage on the row of word lines based on the N bits of data, and buffering the N bits of data.

16. The method of claim 12, wherein the read and program gray codes each comprises a loo-up table that respectively comprises a mapping relationship between the plurality of states of the memory cell and respective gray-coded values; and the method comprises:

receiving the first value;
determining the state corresponding to the first value based on the read gray code; and
determining one gray-coded value mapped to the state based on the program gray code, the one gray-coded value being the second value.

17. The method of claim 12, wherein the first value comprises N bits of data of N pages, and the method comprises converting one bit in the first value to a respective bit in the second value by:

performing an exclusive or (XOR) operation amongst (N−1) bits representing (N−1) pages in the first value to obtain a first XOR value;

performing an XOR operation amongst (N−1) bits representing (N−1) pages in the second value to obtain a second XOR value; and performing an XOR operation amongst the one bit in the first value, the first XOR value, and the second XOR value, to obtain the respective bit in the second value.

18. A system, comprising:
an array of memory cells arranged in a plurality of rows;
a plurality of word lines respectively coupled to the plurality of rows of the memory cells; and
a peripheral circuit coupled to the word lines configured to:
convert a first value to a second value based on a mapping relationship between a read gray code and a program gray code,
perform a program operation to program the second value into a memory cell as a state based on the read gray code, and
perform a read operation to read out the state from the memory cell based on the read gray code to be the first value, and
a memory controller coupled to the memory device and configured to control the memory device.

19. The system of claim 18, further comprising a host coupled to the memory controller.

20. The system of claim 18, wherein the memory controller is coupled to the peripheral circuit and is configured to translate a binary-coded value to the first value.

* * * * *